United States Patent
Shimanek et al.

(10) Patent No.: US 8,222,923 B1
(45) Date of Patent: Jul. 17, 2012

(54) METHOD AND APPARATUS FOR MEMORY CONTROL WITH A PROGRAMMABLE DEVICE

(75) Inventors: Schuyler E. Shimanek, Albuquerque, NM (US); Wayne E. Wennekamp, Rio Rancho, NM (US); Joe E. Leyba, Albuquerque, NM (US); Adam Elkins, Rio Rancho, NM (US); Thomas H. Strader, San Jose, CA (US); Chidamber R. Kulkarni, Hyderabad (IN); Mikhail A. Wolf, Albuquerque, NM (US); Steven E. McNeil, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/694,615

(22) Filed: Jan. 27, 2010

Related U.S. Application Data

(60) Provisional application No. 61/148,926, filed on Jan. 31, 2009, provisional application No. 61/148,927, filed on Jan. 31, 2009.

(51) Int. Cl.
*H03K 19/177* (2006.01)
(52) U.S. Cl. .............................. 326/41; 326/38; 326/47
(58) Field of Classification Search .............. 326/37–41, 326/47, 101
See application file for complete search history.

(56) References Cited

U.S. PATENT DOCUMENTS

| | | | |
|---|---|---|---|
| 6,519,674 B1 * | 2/2003 | Lam et al. ...................... | 711/103 |
| 6,828,822 B1 * | 12/2004 | Bellis et al. ...................... | 326/38 |
| 6,877,076 B1 * | 4/2005 | Cho et al. ...................... | 711/157 |
| 6,924,663 B2 * | 8/2005 | Masui et al. ...................... | 326/38 |
| 7,321,524 B2 * | 1/2008 | Shaeffer et al. ............. | 365/233.1 |
| 7,701,251 B1 * | 4/2010 | Rahman et al. ................. | 326/41 |
| 7,750,676 B2 * | 7/2010 | Kaizu ............................. | 326/47 |

FOREIGN PATENT DOCUMENTS

EP   1 324 495 A1   7/2003

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.

(Continued)

*Primary Examiner* — James H Cho
(74) *Attorney, Agent, or Firm* — Murray Smith; Kevin T. Cuenot

(57) ABSTRACT

A technique is provided for memory control in a device having programmable circuitry, including providing a dedicated memory controller circuit in the device before the programmable circuitry is field programmed. Another technique involves fabricating a device, where the fabricating involves forming programmable circuitry that includes a dedicated memory controller circuit before the circuitry is field programmed.

17 Claims, 13 Drawing Sheets

OTHER PUBLICATIONS

U.S. Appl. No. 12/692,771, filed Jan. 25, 2010, Flateau, Jr., et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.

* cited by examiner

METHOD AND APPARATUS FOR MEMORY CONTROL WITH A PROGRAMMABLE DEVICE

CROSS-REFERENCE TO RELATED APPLICATIONS

This application claims the priority under 35 U.S.C. §119 of U.S. Provisional Patent Application No. 61/148,926 filed on Jan. 31, 2009 and entitled "Apparatus and Method for a Memory Controller", and also U.S. Provisional Patent Application No. 61/148,927 filed on Jan. 31, 2009 and entitled "Architecture for Advanced Integrated Circuit Providing Good Performance and Low Cost". The disclosures of both of these provisional patent applications are hereby incorporated herein by reference in their entirety.

FIELD OF THE INVENTION

An embodiment of the invention relates to memory control. More particularly, an embodiment of the invention relates to memory control with a field programmable device.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

The programmable switch fabric within a PLD device may need to transfer data to or from a memory device that is external to the PLD, and it can be beneficial to provide a memory controller to interface circuitry within the PLD to the external memory device. One approach is to provide a memory controller that is a standalone device external to the PLD. Another approach is to carry out field programming of the PLD so that, during field programming, a memory controller is created within the PLD from general purpose circuit components. Although these existing approaches have been generally adequate for their intended purposes, they have not been entirely satisfactory in all respects.

SUMMARY OF THE INVENTION

One embodiment of the invention involves an apparatus that includes a device having field programmable circuitry that includes a dedicated memory controller circuit before the circuitry is field programmed.

Another embodiment of the invention involves a method that includes fabricating a device where the fabricating including forming field programmable circuitry that includes a dedicated memory controller circuit before the circuitry is field programmed.

DETAILED DESCRIPTION

Figure 1:
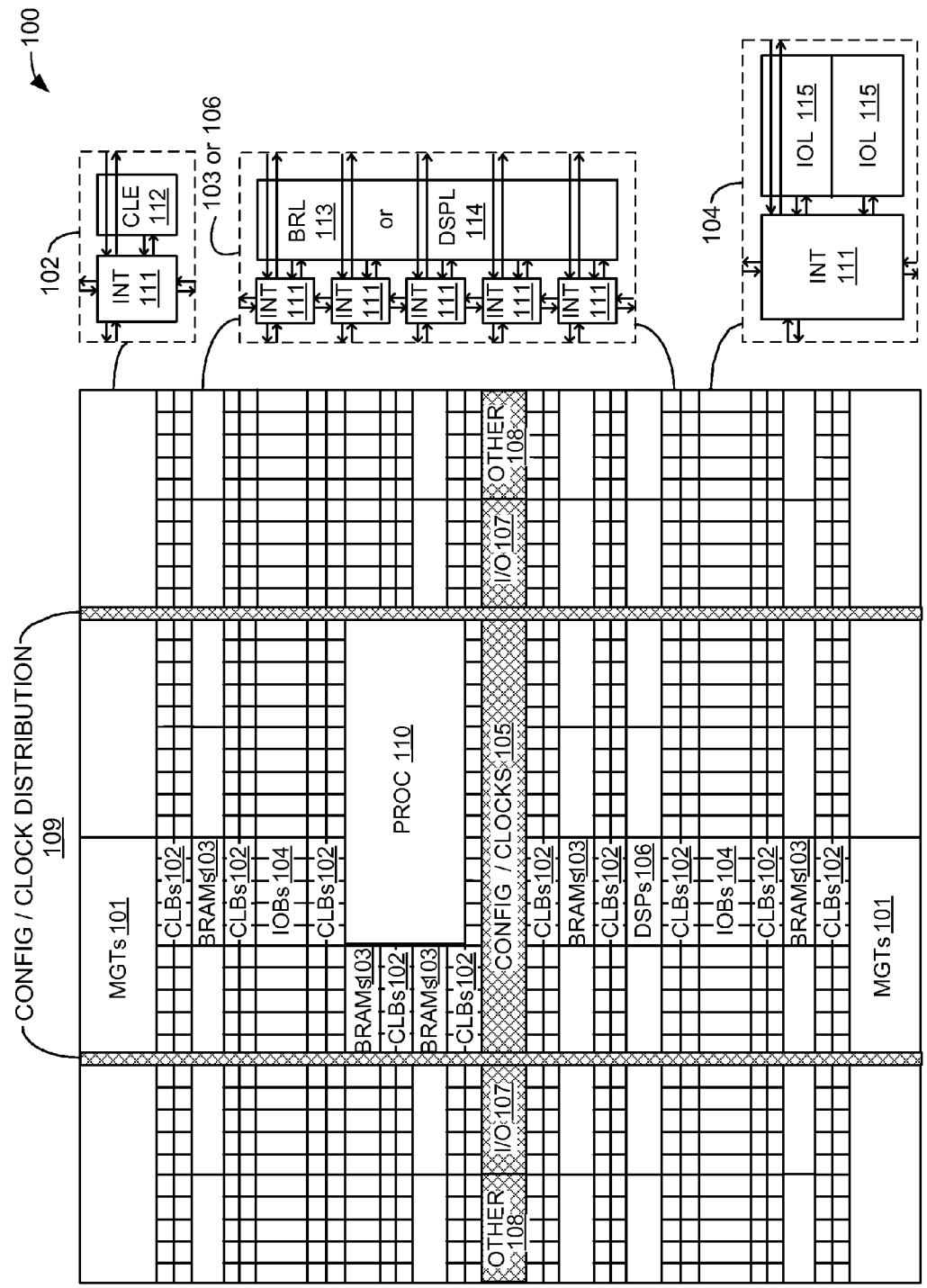
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
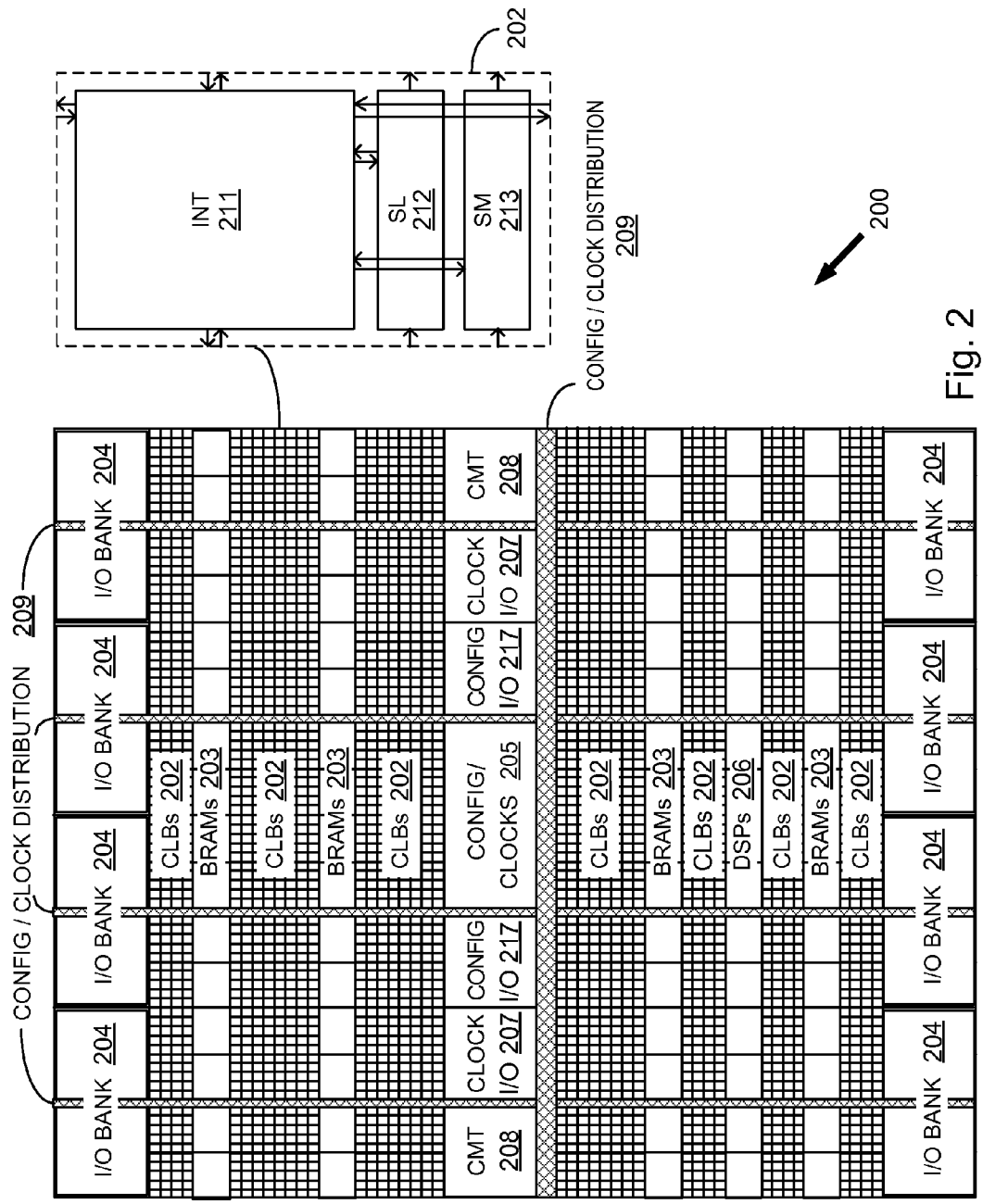
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
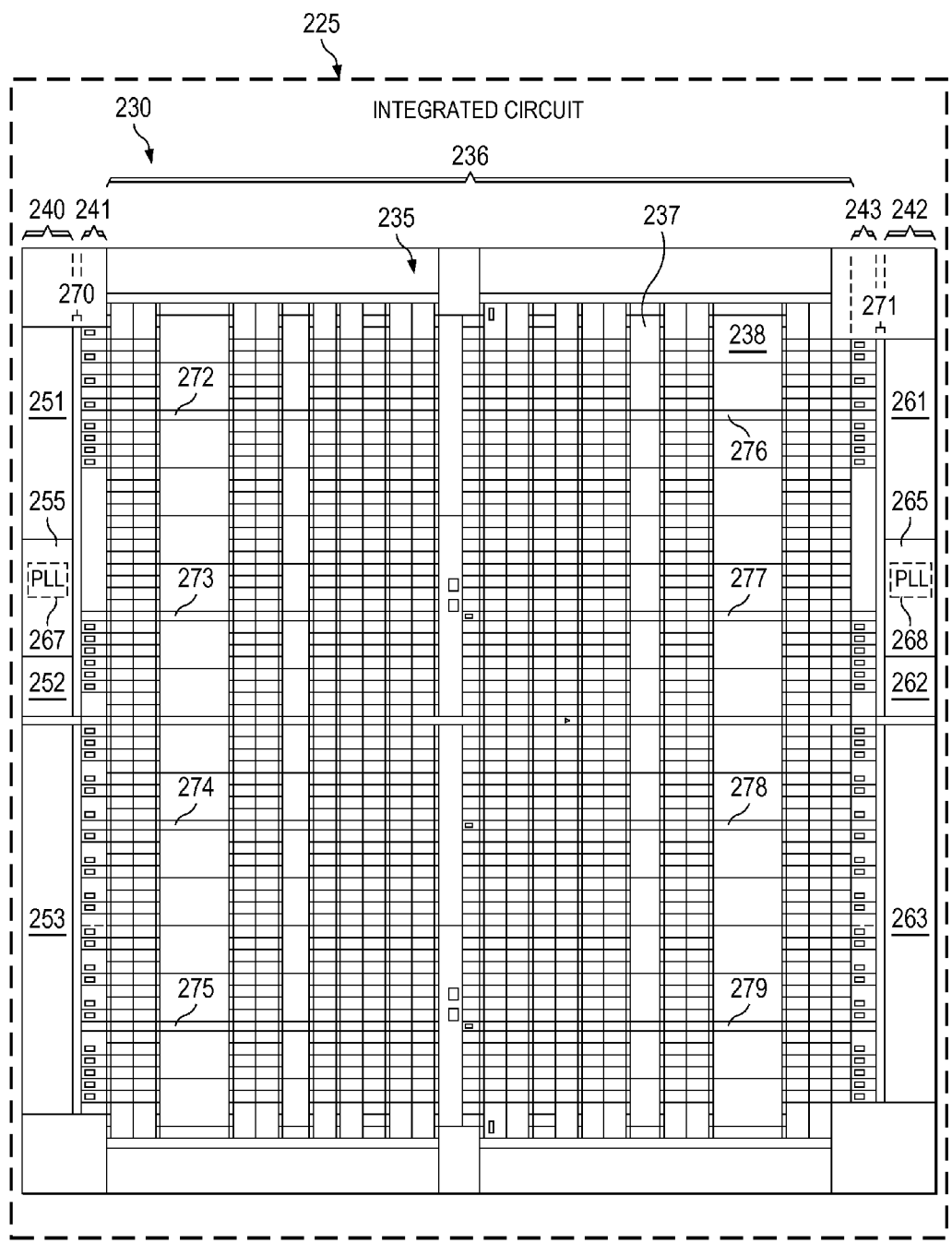
FIG. 3 is a diagrammatic top view of an integrated circuit containing an FPGA that is an alternative embodiment of the FPGAs of FIGS. 1 and 2, and that includes a dedicated memory controller circuit.

FIG. 3 is a diagrammatic top view of an apparatus that is an integrated circuit 225 containing an FPGA 230. The FPGA 230 is an alternative embodiment of the FPGA 100 of FIG. 1 and the FPGA 200 of FIG. 2. The FPGA 230 includes an FPGA fabric 235 that is implemented in a central region 236 of the integrated circuit 225. The FPGA fabric 235 includes a plurality of field programmable tiles, for example tiles 237 and 238, that are of the types discussed above in association with FIGS. 1 and 2.

The integrated circuit 225 includes elongate rectangular regions 240 and 241 on one side of the central region 236 and elongate rectangular regions 242 and 243 on an opposite side of the central region. The elongate region 240 includes input/output (I/O) regions 251, 252 and 253, and a phase-locked-loop (PLL) region 255 disposed between the I/O regions 251 and 252. The elongate region 242 includes I/O regions 261, 262 and 263, and a phase-locked-loop (PLL) region 265 disposed between the I/O regions 261 and 262. A plurality of IOBs (not shown in FIG. 3) are implemented in each of the I/O regions 251-253 and 261-263. Each of the IOBs is similar to the IOB 104 discussed above in association with FIG. 1, and includes I/O receiver and driver circuitry. PLL circuits 267 and 268 are respectively implemented in the PLL regions 255 and 265. The PLL circuits 267 and 268 provide stable clock signals.

The integrated circuit 225 also has a clock distribution region that includes a plurality of elongate clock distribution segments 270-279. The clock distribution segment 270 is disposed between the elongate regions 240 and 241. The clock distribution segment 271 is disposed between the elongate regions 242 and 243. The clock distribution segments 272-275 are approximately perpendicular to the clock distribution segment 270, and intersect the clock distribution segment 270 at spaced locations along the clock distribution segment 270. Spaced portions of the elongate region 241 overlap portions of the clock distribution segments 272-275. The clock distribution segments 276-279 are approximately perpendicular to the clock distribution segment 271, and intersect the clock distribution segment 271 at spaced locations along the clock distribution segment 271. Spaced portions of the elongate region 243 overlap portions of the clock distribution segments 276-279.

Clock buses (not illustrated) are implemented within the clock distribution segments 270-279. The PLL circuit 267 is electrically coupled to the clock bus that is implemented within the clock distribution segments 270 and 272-275, so that the clock signal provided by the PLL circuit 267 can be transmitted through that clock bus. The PLL circuit 268 is electrically coupled to the clock bus that is implemented within the clock distribution segments 271 and 276-279, so that the clock signal provided by the PLL circuit 268 can be transmitted through that clock bus. In this fashion, the respective clock signals provided by the PLL circuits 267 and 268 are distributed to various regions of the integrated circuit 225 through the clock buses.

The FPGA 230 includes two dedicated memory controller circuits that are separate and independent. The memory controller circuits exist before field programming of the FPGA, and facilitate transfers of data between the FPGA fabric 230 and respective external memory devices (not shown in FIG. 3). Here, one of the memory controller circuits is implemented in portions of the elongate region 241 that are not overlapped with the clock distribution segments 272-275, and a virtually identical memory controller circuit is implemented in portions of the elongate region 243 that are not overlapped with the clock distribution segments 276-279. For purposes of simplicity and clarity, only one of these two memory controller circuits will be described in detail. In particular, the operation and physical configuration of the memory controller circuit implemented within the elongate region 241 will be discussed in more detail below.

Figure 4:
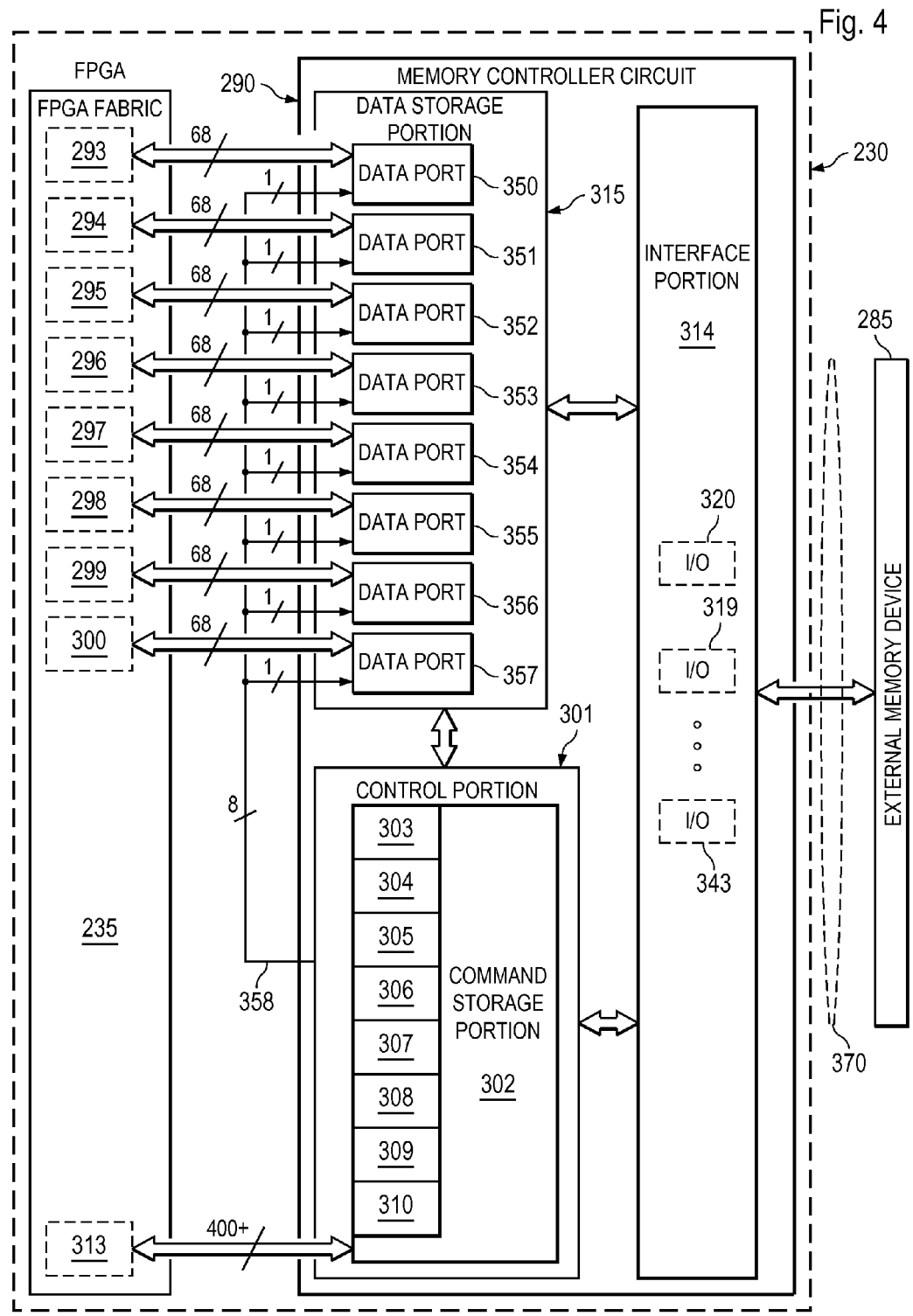
FIG. 4 is a high-level block diagram showing selected portions of the FPGA of FIG. 3, and showing a memory device external to the integrated circuit and the FPGA.

FIG. 4 is a high-level block diagram showing the FPGA fabric 235, an external memory device 285, and a memory controller circuit 290 that is part of the FPGA 230 and that is implemented within the elongate region 241 (FIG. 3). The FPGA fabric 235 can be programmed to include eight circuitry portions 293-300 that each include two programmable tiles that are of the types discussed above in association with FIGS. 1 and 2, and a circuitry portion 313 that includes sixteen of such programmable tiles. The circuitry portions 293-300 and 313, working in conjunction, can transfer data to or from the memory device 285 through the memory controller circuit 290. The circuitry portions 293-300 and 313 would come into being only as the FPGA 230 (FIG. 3) is field programmed. Thus, the specific configuration of the circuitry portions in the FPGA fabric 235 can vary, and the circuitry portions 293-300 and 313 of FIG. 4 represent only one possible configuration and are shown only for exemplary purposes. The memory device 285 is a conventional memory device known in the art, conforming to a standard such as double data rate (DDR, DDR2, DDR3 or LPDDR (mobile DDR)). However, it could alternatively be some other type of memory device. The memory controller circuit 290 includes a control portion or section 301, an interface portion 314, and a data storage portion 315.

The control portion 301 is coupled to the circuitry portion 313 of the FPGA fabric 235, the data storage portion 315, and the interface portion 314. The control portion 301 includes a command storage portion 302. The command storage portion 302 has eight command ports 303-310 that store commands from the FPGA fabric 235. Commands supplied to the command ports 303-310 call for transfer of data between the FPGA fabric 235 and the memory device 285. The eight command ports 303-310 are separate and are coupled to the circuitry portion 313 of the FPGA fabric 235 through a plurality of signal buses that cumulatively include more than 400 signal lines. The control portion 301 includes additional circuitry that works in conjunction with the command storage portion 302 to control the operation of the memory controller circuit 290 and the memory device 285.

The interface portion 314 is coupled to the control portion 301, the data storage portion 315, and the memory device 285. The interface portion 314 includes 24 interface sections 320-343, three of which are visible in FIG. 4 at 320, 321 and 343. The interface sections 320-343 each contain circuitry facilitating the transfer of control and data signals between the memory controller circuit 290 and the memory device 285, and can thus also be referred to as I/O sections. For example, each of the interface sections 320-343 includes two IOBs 104 (FIG. 1). The interface sections 320-343 will be discussed in more detail later.

The data storage portion 315 includes eight field-programmable and independently configurable data port sections (data ports) 350-357, and is coupled to the control portion 301, the interface portion 314, and the FPGA fabric 235. Specifically, an 8-bit port enable signal bus 358 couples the data ports 350-357 to the control portion 301, and eight 68-bit signal buses respectively couple the circuitry portions 293-300 to the data ports 350-357. In each of the eight 68-bit signal buses, 32 of the 68 bits are used for memory read operations, another 32 of the 68 bits are used for memory write operations, and the remaining 4 of the 68 bits are used for masking operations. The memory read and write operations will be discussed in more detail below. The masking operations are not the focal point of the present disclosure and are therefore not discussed herein.

Each of the data ports 350-357 includes circuitry for temporarily storing data traveling from the FPGA fabric 235 to the memory device 285, or from the memory device to the FPGA fabric. Specifically, the data ports 350-357 each include a first-in-first-out (FIFO) storage device that serves as a storage element. In the disclosed embodiment, each FIFO storage device can store up to 64 words that are each 32 bits, but these storage devices could alternatively have some other configuration. The data ports 350-357 can each be configured by user field programming to either supply data to or receive data from the FPGA fabric 235. After field programming, the flow of data through each of the data ports 350-357 is unidirectional. The data ports 350-357 correspond to the command ports 303-310, respectively.

As mentioned above, the data ports 350-357 are separate and independently configurable. From the perspective of the FPGA fabric 235, each of the circuitry portions 293-300 sees an independent and separate interface that is a combination of one of the command ports 303-310 and one of the data ports 350-357. For instance, the circuitry portion 293 sees an interface that is the combination of the command port 303 and the data port 350, and the circuitry portion 300 sees an interface that is the combination of the command port 310 and the data port 357. However, the circuitry portions 293-300 do not communicate directly with the command ports 303-310. Rather, the circuitry portions 293-300 communicate with the circuitry portion 313, which in turn communicates with the command ports 303-310. The circuitry portions 293-300 may each have no knowledge as to the existence and operation of the others, or of interfaces other than its own. For example, the circuitry portion 293 may not be aware of the existence of the data ports 351-357 and the command ports 304-310, and may behave as if it "owns" the entire memory controller circuit 290 through its own interface that is formed of the data port 350 and the command port 303. Meanwhile, the circuitry portion 300 may not be aware of the existence of the data ports 350-356 and the command ports 303-309, and thus may not be aware that, while it is communicating with the data port 357 and command port 310, the circuitry portion 293 may be simultaneously communicating with the data port 350 and the command port 303. This arrangement of separate and independently configurable interfaces may be referred to as a multi-interface structure, or as a multi-port structure in view of the fact that the interfaces may also each be viewed as a form of port.

A memory interface 370 exists between the memory controller circuit 290 and the memory device 285. The memory interface 370 includes electrical conductors that couple the memory controller circuit 290 and the memory device 285. Various industry-standard signals, including control and data signals discussed above, travel through the memory interface 370. Table 1 provides a list of these signals.

TABLE 1

| Name of signal | Function of signal | Direction of signal |
|---|---|---|
| DQ0-DQ15 | Data bus | From and to memory device (bidirectional) |
| UDQS | Upper byte data strobe | From memory device |
| LDQS | Lower byte data strobe | From memory device |
| CLK | Clock | To memory device |
| CLK_N | Inverse of CLK | To memory device |
| WE | Write enable | To memory device |
| CKE | Clock enable | To memory device |
| RAS | Row address strobe | To memory device |
| CAS | Column address strobe | To memory device |
| BA0-BA2 | Bank address | To memory device |
| UDM | Upper byte data mask | To memory device |
| LDM | Lower byte data mask | To memory device |
| A0-A14 | Address | To memory device |
| ODT | On die termination | To memory device |
| RESET | Reset | To memory device |

Now, the operations that occur during a typical memory read situation and a typical memory write situation will be briefly discussed to provide an example of how the memory controller circuit 290 facilitates data transfers between the FPGA fabric 235 and the memory device 285. For the ensuing discussion, assume that the data ports 351, 353, 354 and 355 have been field programmed to only receive data from the FPGA fabric 235, that the data ports 350, 352, 356 and 357 have been field programmed to only supply data to the FPGA fabric 235, and that the circuitry portions 293-300 have already been formed by user field programming. For the sake of clarity and simplicity, the examples of memory read and memory write operations discussed below reflect only the perspective of the circuitry portions 293 and 294.

A memory read is an operation in which the circuitry portion 293 in the FPGA fabric 235 requests and receives data from the memory device 285. To accomplish this, the circuitry portion 293 sends an instruction to the circuitry portion 313, which in turn sends the instruction to the control portion 301 through the command port 303, requesting that a specified amount of data be read, starting at a specified memory address. In response, the control portion 301 sends address and control signals to the memory device 285 through the interface portion 314. In response to these signals, the memory device 285 accesses data starting from the specified address, and outputs DDR data as incoming data to the interface portion 314. The interface portion 314 captures the incoming data and outputs the data to the data storage portion 315. The data is temporarily stored by the data port 350 and then is retrieved by the circuitry portion 293.

A memory write is an operation in which the circuitry portion 294 in the FPGA fabric 235 sends data to the memory device 285. To accomplish this, the circuitry portion 294 outputs data to the data port 351 to be temporarily stored there. Thereafter, the circuitry portion 294 sends an instruction to the circuitry portion 313, which in turn sends the instruction to the control portion 301 through the command port 304, requesting that the data in data port 351 be stored in the memory device 285, starting at a specified address. The control portion 301 communicates with the memory device 285 through the interface portion 314 and specifies which addresses of the memory the data needs to be written to. The command port 304 then sends the data through some of the interface sections 320-343. The data is then written into the memory device 285 at the specified memory addresses.

Although the foregoing examples only illustrate memory read and write operations from the perspective of the circuitry portions 293 and 294, the other circuitry portions 295-300 could be requesting memory read and/or write operations concurrently with the circuitry portions 293 and 294, and in a similar manner.

Figure 5:
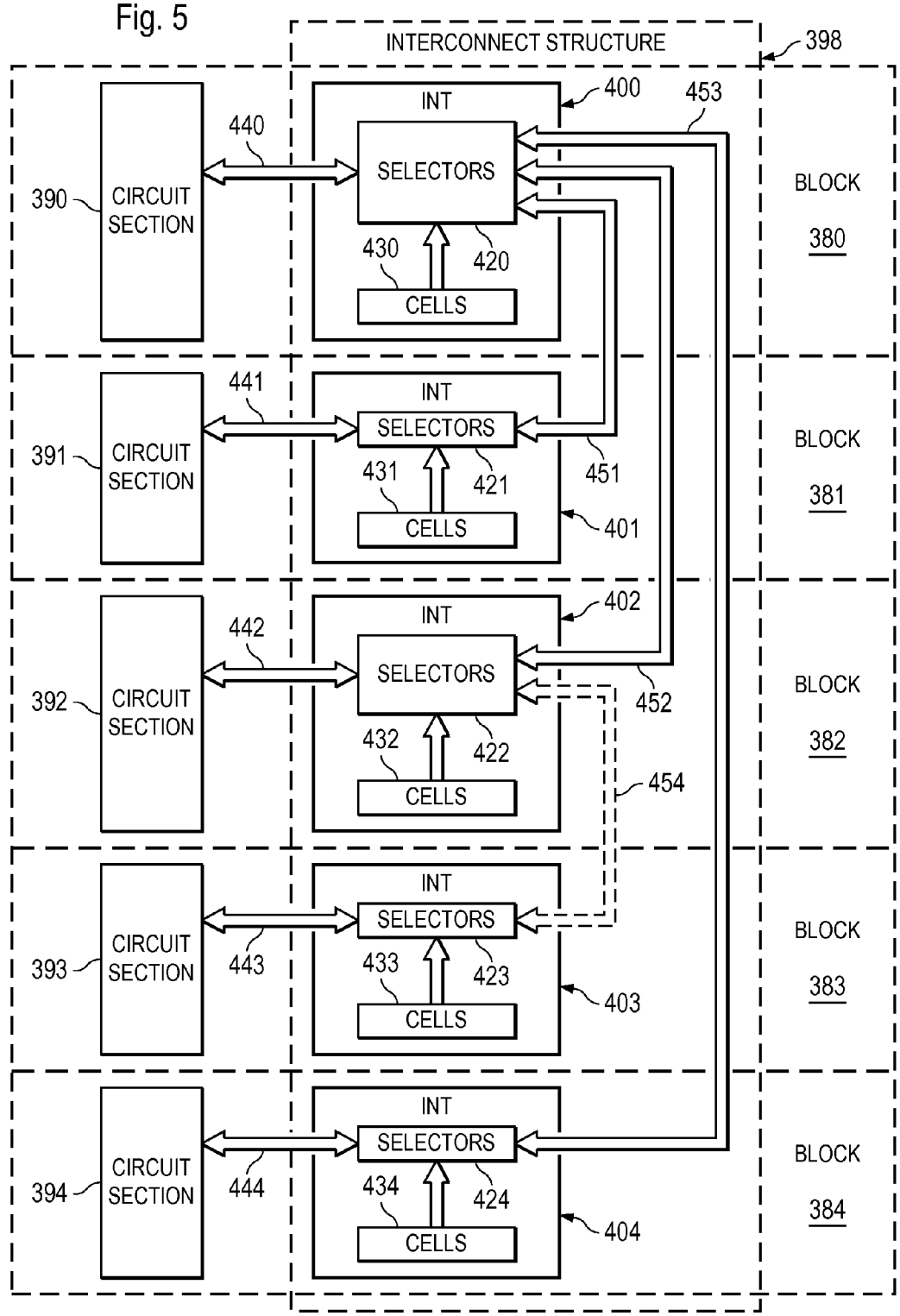
FIG. 5 is a diagram showing several physically contiguous sections or blocks of the integrated circuit of FIG. 3, and showing some circuitry of the FPGA that is present within each of these blocks.

The integrated circuit 225 (FIG. 3) includes a plurality of physically contiguous sections or blocks that each contain circuitry of the FPGA 230 (FIG. 3). FIG. 5 is a diagram showing several of these physically contiguous sections or blocks at 380-384, and showing some circuitry of the FPGA that is present within each of these blocks. In particular, the blocks 380-384 respectively contain circuit sections 390-394 that are portions of the circuitry within the FPGA 230. The FPGA 230 also includes an interconnect structure 398 that is represented diagrammatically in FIG. 5 by a broken line. The interconnect structure 398 routes incoming signals from an external device (such as the memory device 285 of FIG. 4) to various sections of the FPGA, routes outgoing signals from the FPGA 230 to the external device, and routes internal signals traveling within the FPGA. The interconnect structure 398 contains a plurality of interconnection sections that are implemented on the blocks. For purposes of simplicity, FIG. 5 only shows five such interconnection sections 400-404, which are respectively implemented within the blocks 380-384.

The interconnection sections 400-404 include respective selectors sections 420-424, as well as respective programmable memory cells sections 430-434. The selectors sections 420-424 each include routing circuitry such as switches or multiplexers that route electrical signals traveling through the respective interconnection sections 401-404. The memory cells sections 430-434 are respectively coupled to the selectors sections 420-424, and instruct the selectors sections to implement desired routing configurations in accordance with user field programming. The circuit sections 390-394 are respectively coupled to the selectors sections 420-424 through hard-wiring at 440-444.

Each interconnection section is directly electrically coupled to some but not all of the other interconnection sections. In FIG. 5, the interconnection section 400 is not directly electrically coupled to the interconnection section 403, but is directly electrically coupled to the three interconnection sections 401, 402, and 404 through respective metallization runs 451, 452, and 453. More specifically, the selectors section 420 is coupled to the selectors sections 421, 422, and 424, through the respective metallization runs 451, 452, and 453. However, there are no direct metallization runs between the selectors sections 420 and 423, and thus no direct electrical coupling exists between the interconnection sections 400 and 403. The selectors section 423 is directly coupled to the selectors section 422 through metallization runs 454 (shown in broken lines to avoid confusion with the metallization runs 451-453 that are directly coupled to the selectors section 420). The metallization runs 451-454 each include vias, contacts, and metal interconnect lines in various layers of the integrated circuit 225 (FIG. 3).

The circuit section 390 is capable of communicating directly with any of the circuit sections 391, 392, or 394 going through an intermediate interconnection section. To illustrate, if the memory cells sections 430-432 and 434 are appropriately programmed during field programming, then a signal sent by the circuit section 390 can be routed to the circuit section 391 through the selectors section 420, the metallization runs 451, and the selectors section 421. Similarly, the same signal from the circuit section 390 can be routed to the circuit section 392 through the selectors section 420, the metallization runs 452, and the selectors section 422. The same signal from the circuit section 390 can also be routed to the circuit section 394 through the selectors section 420, the metallization runs 453, and the selectors section 424. However, for that same signal to be routed to the circuit section 393, the signal has to be routed through an intermediate interconnection section. For example, the signal sent from the circuit section 390 may first be routed through the selectors section 420 and the metallization runs 452 to the selectors section 422 of the interconnection section 402, which serves as the intermediate interconnection section. The selectors section 422 can then route that signal to the circuit section 393 through the metallization runs 454 and the selectors section 423 to the circuit section 393. It is not necessary for the selectors section 422 to route that signal to the circuit section 392, although it may do so.

Figure 6:
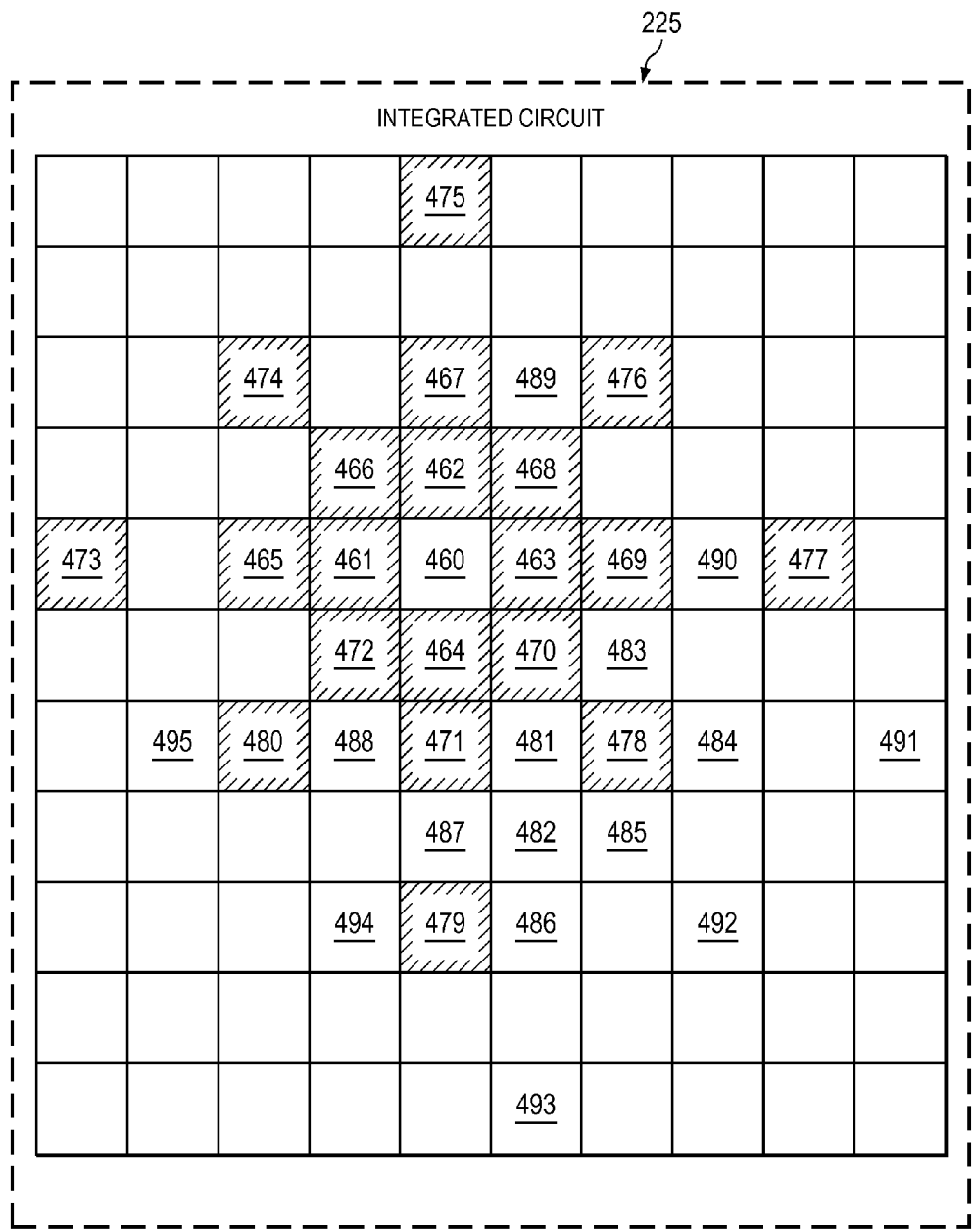
FIG. 6 is a diagrammatic top view of an array of physically contiguous sections or blocks of the integrated circuit of FIG. 3

FIG. 6 is a diagrammatic top view of an array of physically contiguous sections or blocks of the integrated circuit 225 (FIG. 3). Each of these blocks in FIG. 6 is similar to one of the blocks 380-384 in FIG. 5. FIG. 6 is used to explain the configuration of electrical coupling between these blocks. The blocks are diagrammatically illustrated in FIG. 6 as rows and columns of adjacent rectangular blocks, where each of the blocks contains a not-illustrated interconnection section similar to the interconnection sections 400-404 (FIG. 5), and contains a not-illustrated circuit section similar to the circuit sections 390-394 (FIG. 5).

Distances between blocks in FIG. 6 are measured in "Manhattan distance", which is the distance between two points measured along orthogonal axes. As applied to the case at hand, the Manhattan distance between the blocks is measured in terms of blocks in orthogonal directions along columns and rows. As one example, the Manhattan distance between the blocks 478 and 460 is a sum of the distance between the blocks 460 and 471 and the distance between blocks 471 and 478. The Manhattan distance between the blocks 471 and 460 is two blocks, since a signal from 460 has to travel a distance of two blocks to get to the block 471. Similarly, the Manhattan distance between the blocks 471 and 478 is also two blocks. Therefore, the Manhattan distance between the blocks 460 and 478 is four blocks (two blocks+two blocks).

Each of the blocks in FIG. 6 is directly electrically coupled to all blocks that are one or two blocks away in Manhattan distance, and is also directly coupled to some but not all blocks that are four blocks away in Manhattan distance. As one example, from the perspective of block 460, blocks 461-464 are each one block away, and blocks 465-472 are each two blocks away. Thus, direct electrical coupling exists between the block 460 and the blocks 461-464 and 465-472. Direct electrical coupling also exists between block 460 and certain blocks that are four blocks away in Manhattan distance. In particular, blocks 473-480 are each four blocks away and are each directly electrically coupled to the block 460. Thus, the interconnection sections in the blocks 461-480 are each directly electrically coupled through respective metallization runs to the interconnection section in the block 460. For ease of illustration, all of the blocks 461-480 that are directly electrically coupled to block 460 are designated in FIG. 6 by shading.

Although not specifically illustrated, the coupling pattern discussed above for block 460 also exists for each of the other blocks of the integrated circuit 225 (FIG. 3). As an example, from the perspective of block 481, blocks 471, 470, 478, and 482 are one block away, blocks 464, 463, and 483-488 are two blocks away, and blocks 461 and 489-495 are four blocks away. Thus, direct electrical coupling exists between the interconnection section in block 481 and the interconnection sections in each of blocks 471, 470, 478, 482, 464, 463, 483-488, 461 and 489-495.

However, no direct electrical coupling exists between the blocks 481 and 460. Thus, for a signal to be routed from the circuit section in block 460 to the circuit section in block 481, the signal would need to be routed through an intermediate interconnection section, such as the interconnection section in one of the blocks 461, 463, 464, 470, 471, or 478, each of which is directly electrically coupled to both of blocks 460 and 481. The specific path of each signal through the interconnect structure 398 is set during user field programming of the memory cells sections that control the selector sections in each of the interconnection sections, and does not subsequently change during system operation. Hence, the interconnect structure 398 allows a signal from a given interconnection section to be routed to any other interconnection section of the interconnect structure.

Figure 7:
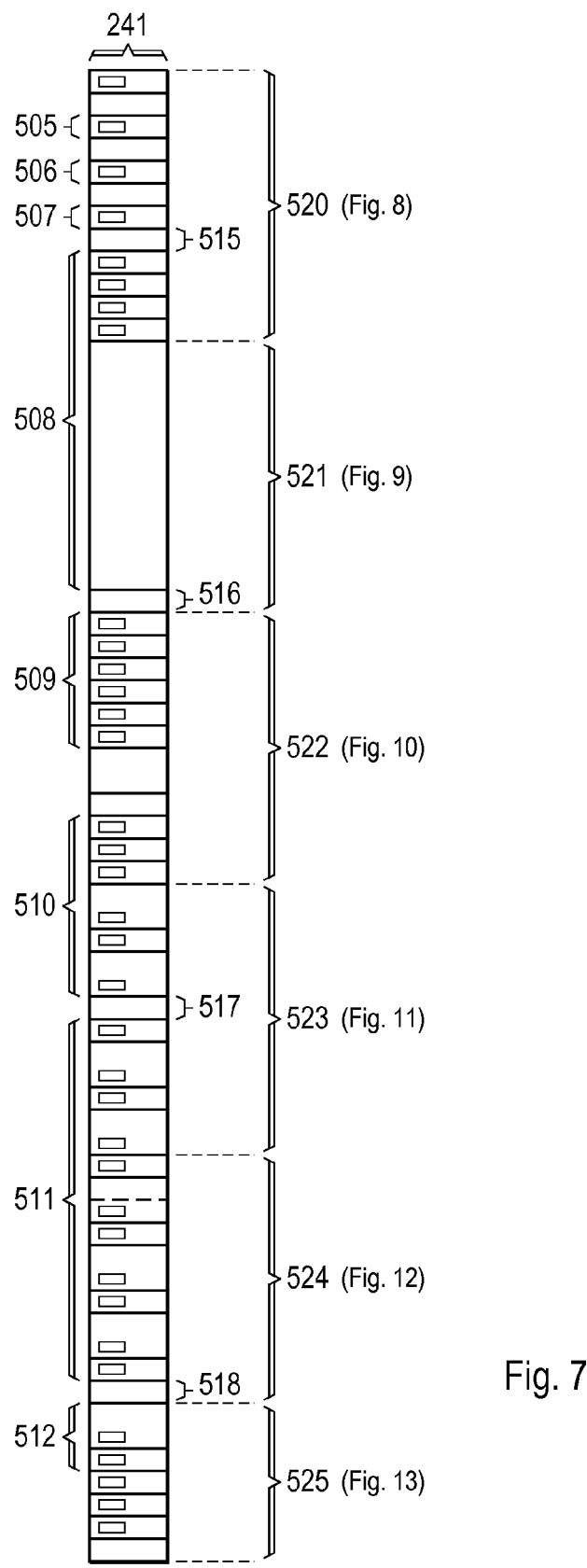
FIG. 7 is a diagrammatic top view of an elongate region of the integrated circuit of FIG. 3.
Figure 8:
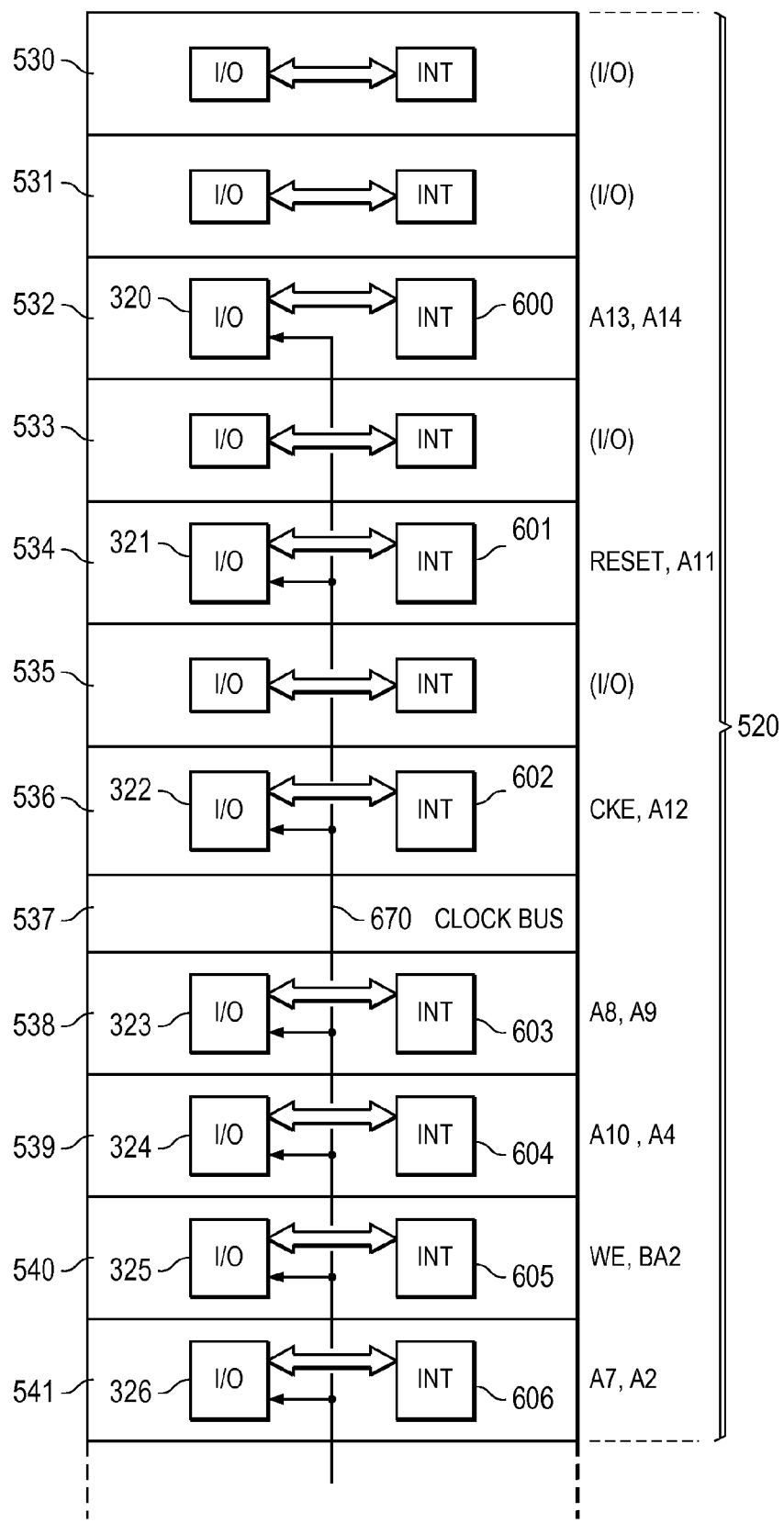
FIGS. 8-13 are diagrammatic top views showing in more detail and in an enlarged scale respective segments of the elongate region of FIG. 7.

FIG. 7 is a diagrammatic top view of the elongate region 241 (FIG. 3) in which the memory controller circuit 290 (FIG. 4) is implemented. The elongate region 241 includes portions 505-512, each containing one or more blocks in which respective circuit sections of the memory controller circuit 290 are implemented. These blocks are similar to the blocks described above in association with FIG. 6. As can be seen from FIG. 7, the elongate region 241 in which the memory controller circuit 290 is implemented has portions 505-512 that together constitute a majority of the "real estate", or area, of the elongate region. The remaining portions of the elongate region 241 include blocks containing other circuitry that is not a part of the memory controller circuit 290. This other circuitry includes clock buses and standard input/output circuitry. As discussed previously in association with FIG. 3, spaced portions of the elongate region 241 overlap with portions of the clock distribution segments 272-275 (FIG. 3). These overlapping portions are shown at 515-518 in the elongate region 241.

The elongate region 241 can be conceptually broken into six segments 520-525. FIGS. 8-13 are diagrammatic top views of these respective segments 520-525, and show these segments in more detail and in an enlarged scale. The segment 520 includes blocks 530-541, the segment 521 includes blocks 542 and 543, the segment 522 includes blocks 544-554, the segment 523 includes blocks 555-562, the segment 524 includes blocks 563-569, and the segment 525 includes blocks 570-576.

The interconnect structure 398 discussed above in association with FIG. 5 includes interconnection sections 600-651. The interconnection sections 600-651 are implemented throughout the segments 520-525 in a physically distributed fashion. Specifically, the blocks 532, 534, 536, 538-541, 544-549, 552-554, 556, 559, 561, 563, 565, 567, 569, and 572 respectively contain the interconnection sections 600-606, 619-627, 630, 633, 636, 639, 642, 645, 648, and 651. The block 542 contains twelve interconnection sections 607-618. The blocks 555, 557, 560, 562, 564, 566, 568, and 571 each contains two of the interconnection sections 628-629, 631-

632, 634-635, 637-638, 640-641, 643-644, 646-647, and 649-650. The distributed implementation of the interconnection sections 600-651 helps to reduce potential signal bottlenecks when field programming the routing within the interconnect structure, because the numerous signals relating to the memory controller circuit 290 do not have to all be routed to or from a single small area.

The 24 interface sections 320-343 (FIG. 4) are respectively implemented in blocks 532, 534, 536, 538-541, 544-549, 552-554, 556, 559, 561, 563, 565, 567, 569, and 572, and are respectively hard-wired to the interconnection sections 600-606, 619-624, 625-627, 630, 633, 636, 639, 642, 645, 648, and 651 in those blocks. The interface sections 320-343 each include some circuitry, such as factory-set programmable delay circuits that adjust the propagation delay of signals entering or exiting the FPGA 230 (FIG. 3). For clarity and ease of reference, the names of the signals handled by each of the interface sections 320-343 are shown next to the block in which the interface section is implemented.

The interface sections 320, 321, 322, 323, 324, 326, 328, 330, and 331 handle the memory address signals A0-A14. The interface section 321 also handles the reset signal RESET. The interface section 322 handles the clock enable signal CKE. The interface section 330 handles the on-die termination signal ODT. The interface sections 325 and 327 handle the bank address signals BA0-BA2. The interface section 325 also handles the write enable signal WE. The interface section 329 handles the clock signal CLK and the inverse clock signal CLK_N. The interface section 332 handles the row address strobe signal RAS and the column address strobe signal CAS. The interface section 333 includes a circuitry portion 333A that handles the upper byte data mask signal UDM and the lower byte data mask LDM. For the sake of clarity, this circuitry portion 333A is illustrated separately from the interface section 333. The interface section 336 handles the lower byte data strobe signal LDQS 660, which is effectively a clock signal of the memory device 285 (FIG. 3). The interface section 336 also includes not-illustrated preamble detection circuitry that provides a prediction of when the clock signal LDQS 660 of the memory device 285 will occur. The interface section 341 handles the upper byte data strobe signal UDQS 665.

The interface sections 334, 335, 337, 338, 339, 340, 342, and 343 handle the incoming data signals DQ0-DQ15. The interface sections 334, 335, 336, 337, 338, 339, 340, 341, 342, and 343 each include data capture circuitry portions 334A, 335A, 336A, 337A, 338A, 339A, 340A, 341A, 342A, and 343A, respectively. The data capture circuitry portions 334A, 335A, 336A, 337A, 338A, 339A, 340A, 341A, 342A, and 343A each capture the incoming data signals (DQ0-DQ15) from the memory device 285 (FIG. 4) and convert DDR data to single data rate (SDR) data. For the sake of providing more clarity, these data capture circuitry portions are illustrated separately from their respective interface sections. In the capturing process, the data capture circuitry portions 334A, 335A, 336A, 337A, 338A, 339A, 340A, 341A, 342A, and 343A also transition the incoming data from synchronization to a clock of the memory device to synchronization with an internal clock of the FPGA 230 (FIG. 3). The data capture circuitry portions 334A, 335A, 336A, 337A, 338A, 339A, 340A, 341A, 342A, and 343A then output the captured data to the data ports 350-357 in the data storage portion 315 (FIG. 4). The interface sections 334, 335, 337, 338, 339, 340, 342, and 343 also handle the outgoing data signals travelling to the memory on DQ0-DQ15. The data capture circuitry portion 336A provides the clock signal LDQS 660, which is coupled to the data capture circuitry portions 334A, 335A, 337A, and 338A. The data capture circuitry portion 341A provides the clock signal UDQS 665, which is coupled to the data capture circuitry portions 339A, 340A, 342A, and 343A.

Figure 9:
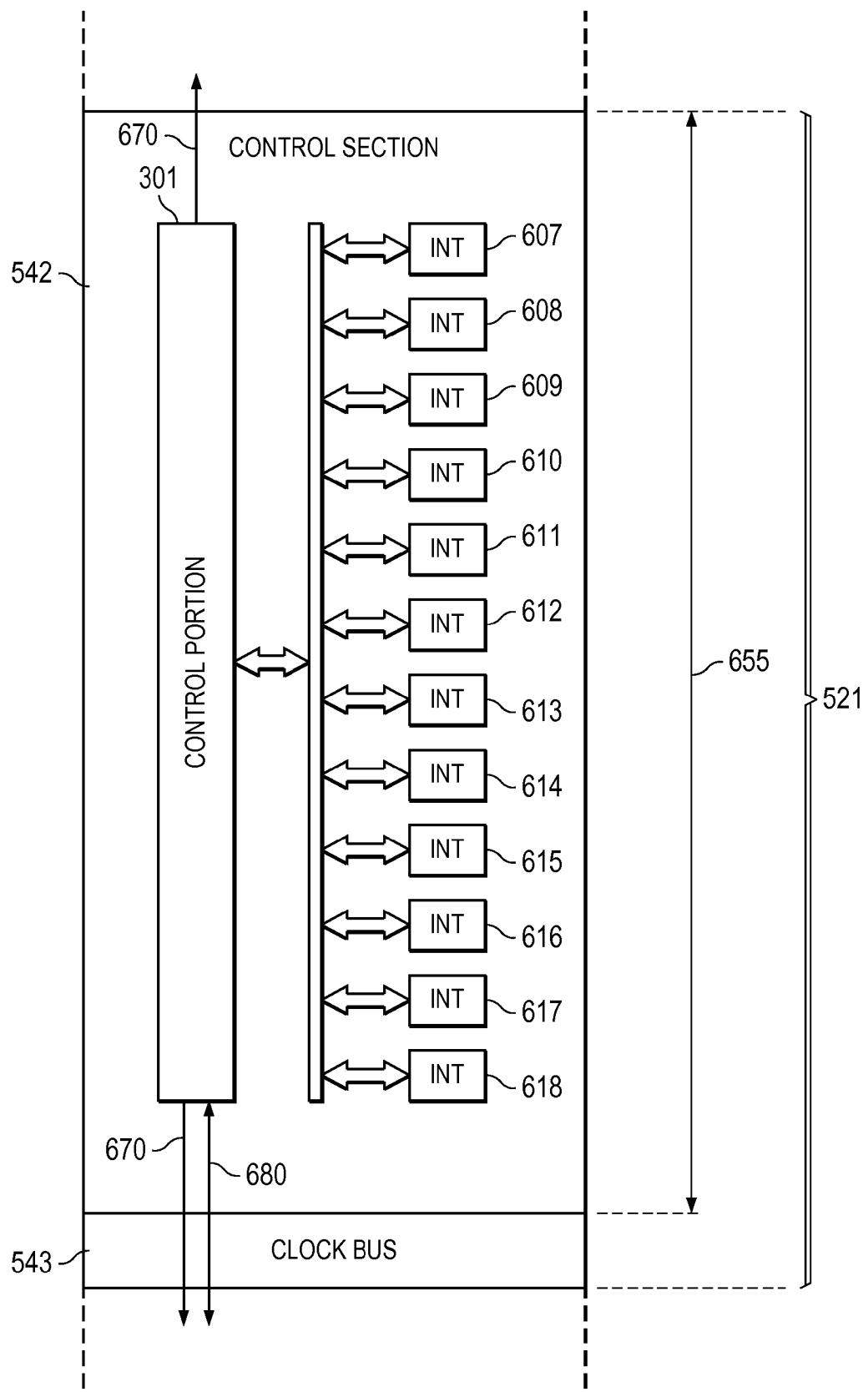
Figure 10:
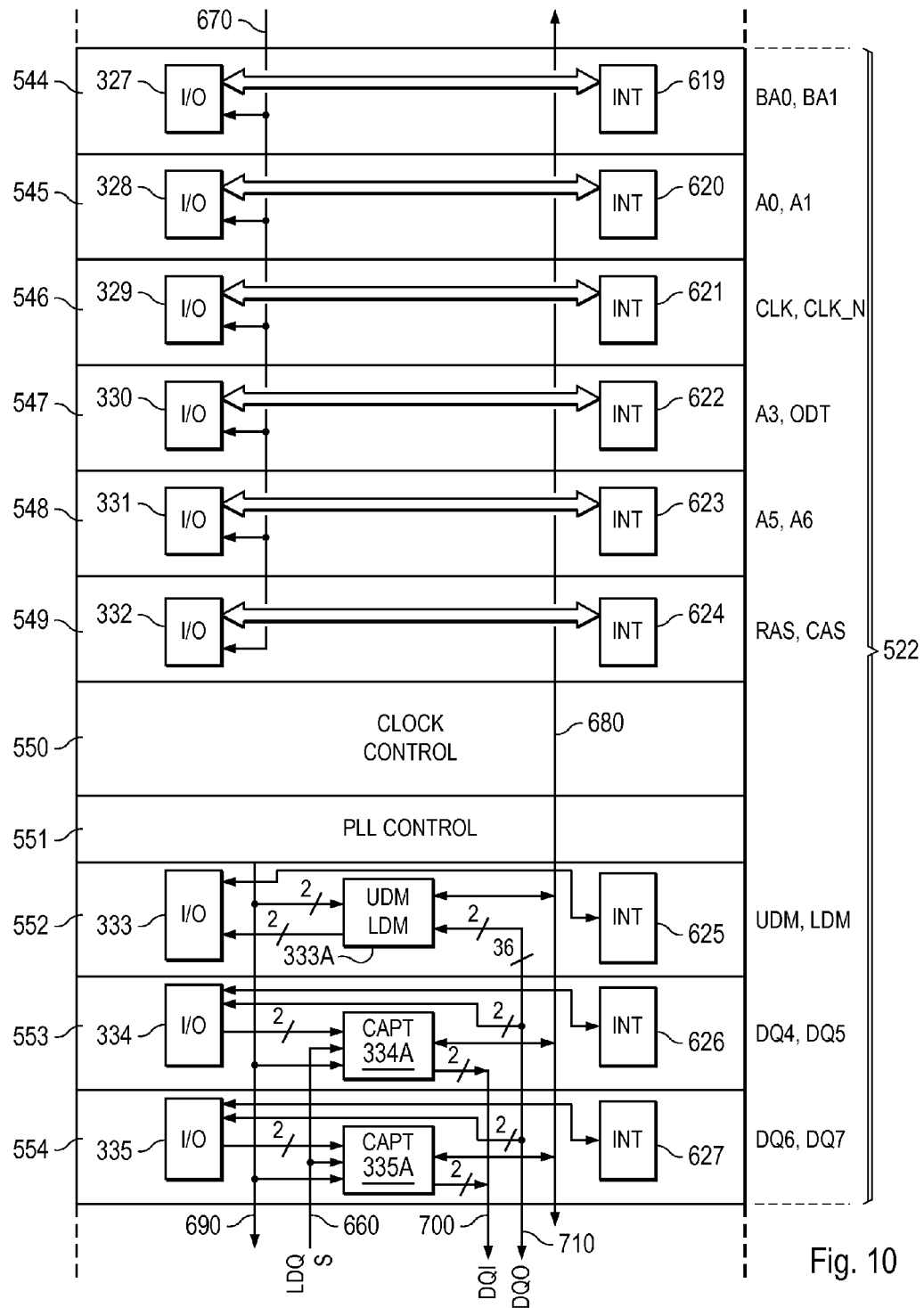

Referring to FIG. 9, the block 542 contains the control portion 301 discussed above in association with FIG. 4. The control portion 301 is hard-wired to the 12 interconnection sections 607-618. These 12 interconnection connections 607-618 are implemented in a physically distributed fashion along the block 542. The control portion 301 is also hardwired to each of the interface sections 320-332 through a bus 670. In addition, the control portion 301 provides control signals through a bus 680 to the circuitry portion 333A in block 552, the data capture circuitry portions 334A, 335A, 336A, 337A, 338A, 339A, 340A, 341A, 342A, and 343A, and the data ports 350-357. The block 542 has a dimension 655 in a direction lengthwise of the elongate region 241 (FIGS. 3 and 7).

Figure 11:
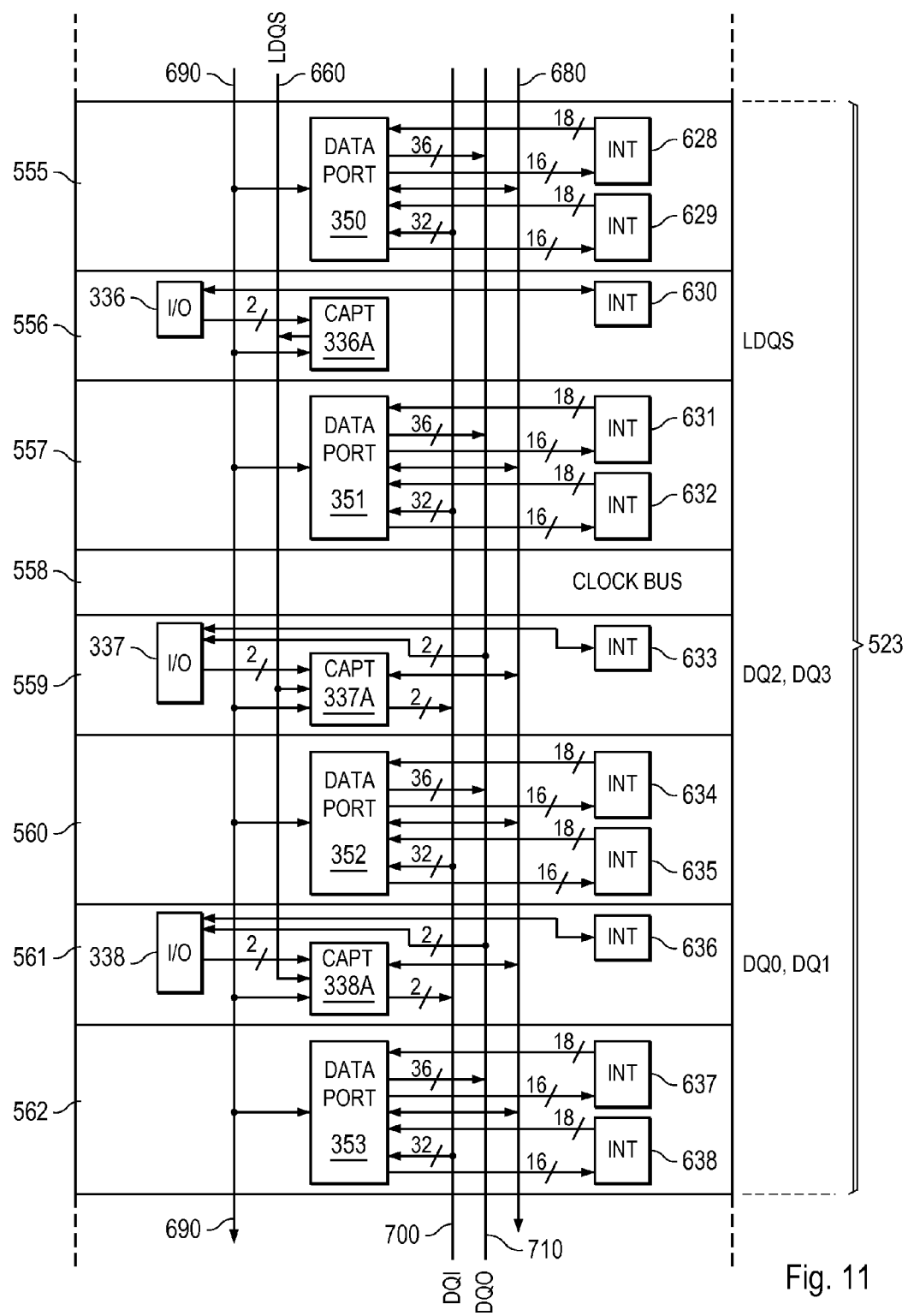
Figure 12:
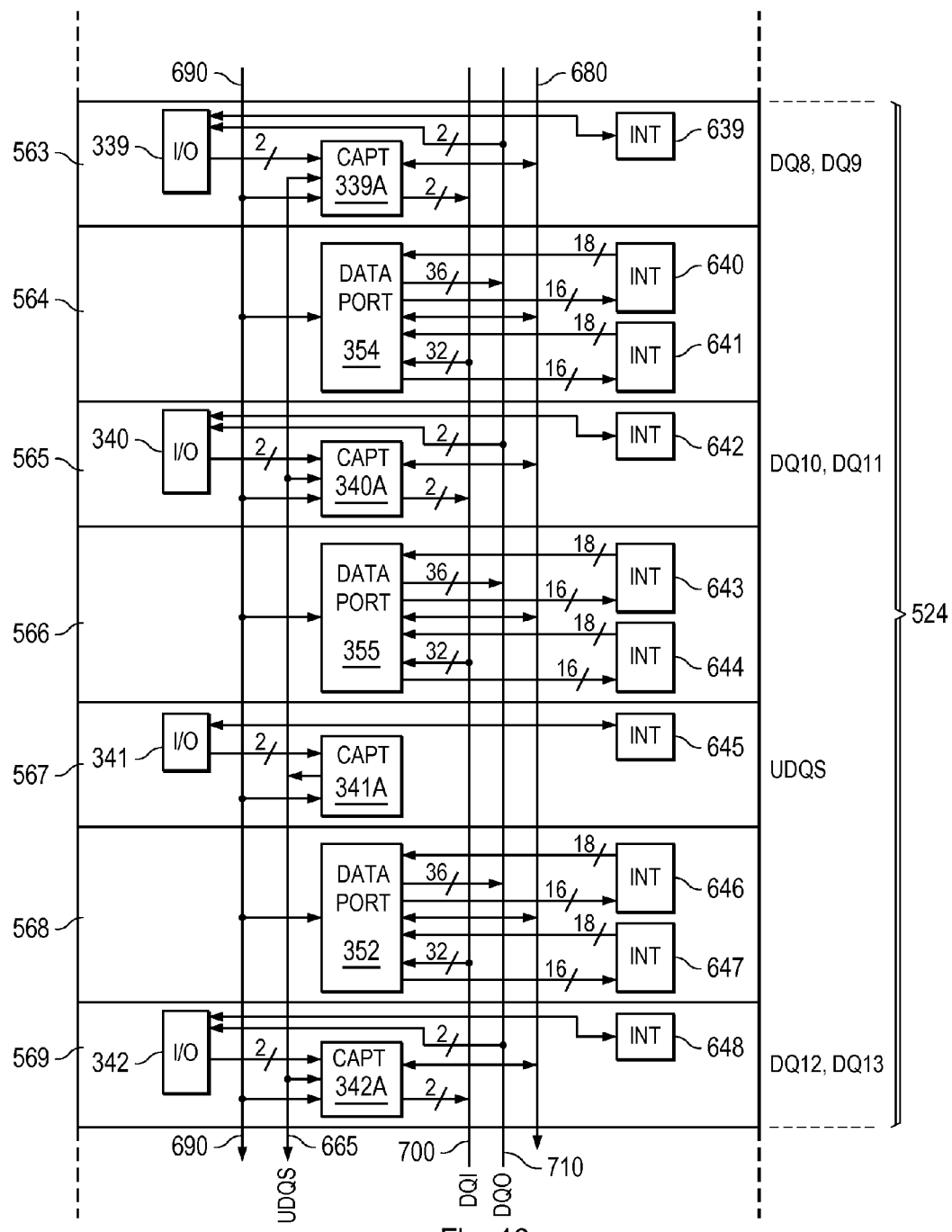
Figure 13:
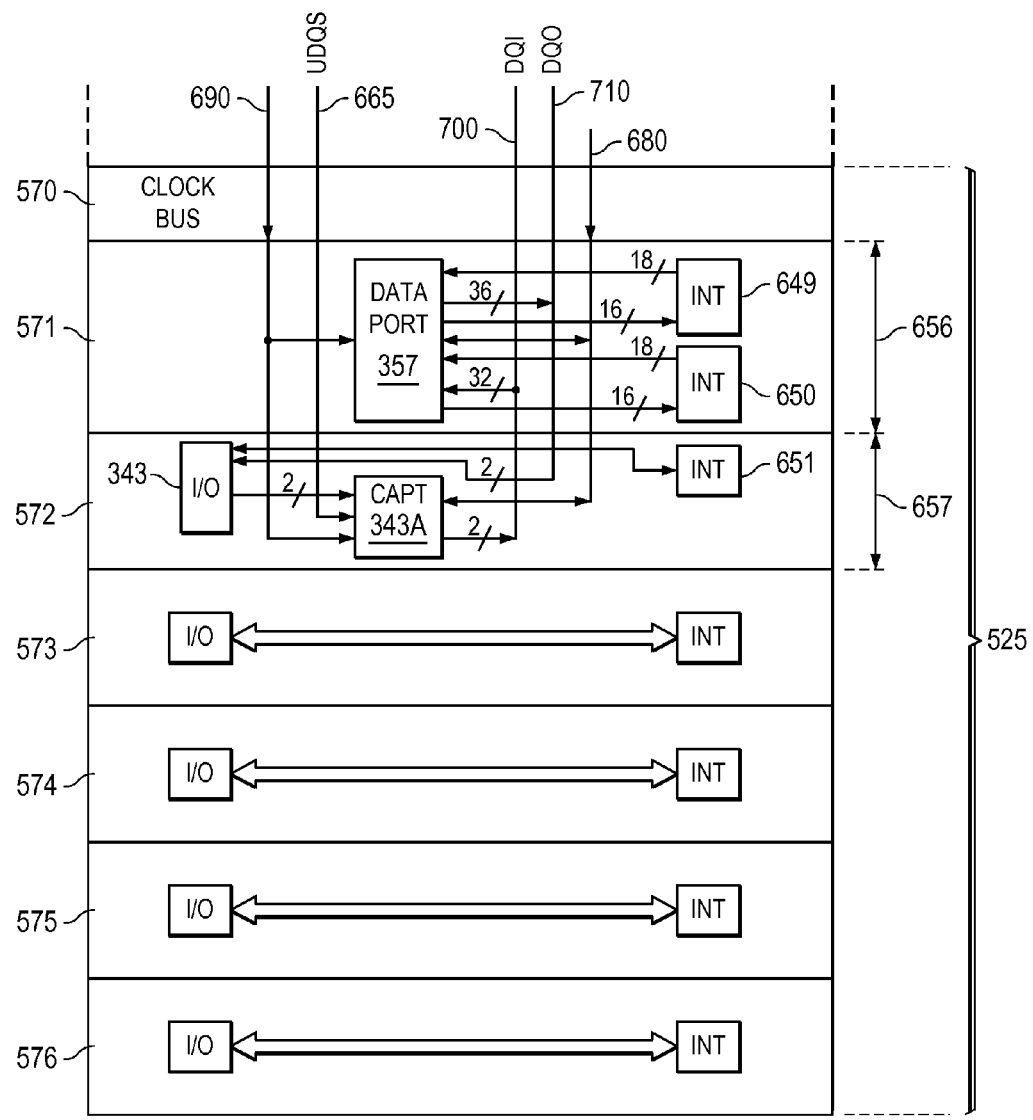

In FIGS. 11-13, the eight data ports 350-357 discussed above in association with FIG. 4 are respectively implemented in the blocks 555, 557, 560, 562, 564, 566, 568, and 571. In each of the blocks 555, 557, 560, 562, 564, 566, 568 and 571, the data port 350, 351, 352, 353, 354, 355, 356 or 357 is hard-wired to the two interconnection sections 628-629, 631-632, 634-635, 637-638, 640-641, 643-644, 646-647, or 649-650 in that block. As illustrated, the blocks 555, 557, 560, 562, 564, 566, 568 and 571 are spaced apart along the elongate region 241, and are separated by other blocks.

With reference to FIGS. 11-13, the blocks 555, 557, 560, 562, 564, 566, 568, and 571 each have a dimension 656 (FIG. 13) in the same direction as the dimension 655 (FIG. 9). The blocks 532, 534, 536, 538-541, 544-549, 552-554, 556, 559, 561, 563, 565, 567, 569 and 572 each have a dimension 657 (FIG. 13) in the same direction. In the disclosed embodiment, the dimension 655 of the block 542 (FIG. 9) is substantially greater than the dimensions 656 and 657, and the dimension 656 is approximately twice the dimension 657. However, these relative dimensions could alternatively be different.

Blocks 530-531, 533, 535, 537, 543, 550, 551, 558, 570, and 573-576 contain circuitry that is not a part of the memory controller circuit 290 (FIG. 4). The blocks 537, 543, 558, and 570 are respectively in the overlapping portions 515-518 (FIG. 7) of the elongate region 241 (FIGS. 3-4), and each contain clock buses. Block 550 contains circuitry that performs clock control. Block 551 contains circuitry that handles PLL connections. Specifically, the circuitry in the block 551 provides two clock signals 690 that are coupled to the data capture circuitry portions 334A, 335A, 336A, 337A, 338A, 339A, 340A, 341A, 342A, and 343A, as well as the circuitry portion 333A and the data ports 350-357. Blocks 530-531, 533, 535, and 573-576 each include standard input/output circuitry.

FIGS. 10-13 also illustrate a 32-bit DQI bus 700 and a 36-bit DQO bus 710. The DQI bus 700 is a data bus through which data travels to the memory controller circuit 290 (FIG. 4) from the external memory device 285 (FIG. 4). The DQO bus 710 is a data bus through which data travels to the external memory device 285 from the memory controller circuit 290. More specifically, with respect to the DQI bus 700, the capture circuitry portions 334A, 335A, 337A, 338A, 339A, 340A, 342A, and 343A each output 4 bits of captured data from the external memory device 285 to the DQI bus 700. The data is then transferred from the DQI bus 700 to the data ports 350-357 in 32-bit format. With respect to the DQO bus 710, each of the data ports 350-357 outputs 36 bits of data (including 4 mask bits that are not discussed in detail herein) to the DQO bus 710, and the data is then transferred from the DQO bus 710 to the interface sections 334, 335, 337, 338, 339, 340, 342, and 343 in 4-bit format. 2 bits of the data is also transferred from the DQO bus 710 to the circuitry portion 333A in the block 552.

As FIGS. 8-13 illustrate, the interconnection sections 600-651 are hard-wired to the memory controller circuit 290 (FIG. 4). In particular, the interconnection sections 600-606 are respectively hard-wired to the interface sections 320-326, the interconnection sections 607-618 are hard-wired to the control portion 301, the interconnection sections 619-627 are respectively hard-wired to the interface sections 327-335, the interconnection sections 630, 633, 636, 639, 642, 645, 648, and 651 are respectively hard-wired to the interface sections 336-343, and the interconnection sections 628-629, 631-632, 634-635, 637-638, 640-641, 643-644, 646-647, 649-650 are respectively hard-wired to the data ports 350-357.

The operations of the memory controller circuit 290 (FIG. 4) discussed above pertain to a normal mode of operation. In the normal mode of operation, the interconnection sections 600-651 transfer electrical signals between the memory controller circuit 290 and circuitry external to the memory controller circuit 290. However, for an application where the memory controller circuit 290 is not needed, the FPGA 230 can be configured during field programming so that the memory controller circuit 290 is bypassed. In the bypass mode, the memory controller circuit 290 is not used or accessed. In other words, from the perspective of the FPGA fabric 235 (FIG. 4), it is as if the memory controller circuit 290 functionally does not exist. Nevertheless, the interconnection sections 600-651 (that are still hard-wired to the memory controller circuit 290) can still be used to route electrical signals travelling between circuits external to the memory controller circuit 290.

Although a selected embodiment has been illustrated and described in detail, it should be understood that substitutions and alterations are possible without departing from the spirit and scope of the present invention, as defined by the claims that follow.

What is claimed is:

1. An apparatus comprising a device having programmable circuitry that includes a dedicated memory controller circuit before the circuitry is field programmed;
    wherein the device includes an integrated circuit in which the programmable circuitry is implemented, the integrated circuit having a plurality of blocks;
    wherein the dedicated memory controller circuit is configured to communicate with a memory device external to the integrated circuit;
    wherein the dedicated memory controller circuit includes a plurality of circuit sections, each of the circuit sections being implemented within a respective one of the blocks; and
    wherein the programmable circuitry includes an interconnect structure, the interconnect structure having a plurality of field programmable interconnection sections that selectively route electrical signals, each of the interconnection sections being implemented in a respective one of the blocks and being coupled to the circuit section in the block.

2. The apparatus of claim 1, wherein the plurality of circuit sections are separate and are physically spaced apart from one another within the integrated circuit, the plurality of circuit sections being one of:
    a plurality of data port sections that temporarily store data being transferred relative to the memory controller circuit;
    a plurality of interface sections that facilitate transfers of data relative to the memory controller circuit; and
    the plurality of field programmable interconnection sections that selectively route electrical signals and are respective portions of a common interconnect structure.

3. The apparatus of claim 1, wherein the interconnect structure comprises first, second, and third field programmable interconnection sections that each have routing circuitry therein that routes electrical signals in response to field programming, the first interconnection section being hard-wired to the memory controller circuit, wherein the first interconnection section has one of the following configurations after field programming:
    the routing circuitry within the first interconnection section transfers electrical signals between the memory controller circuit and the second interconnection section; and
    the routing circuitry within the first interconnection section transfers electrical signals between the second and third interconnection sections through the first interconnection section while bypassing the memory controller circuit.

4. The apparatus of claim 1, wherein the integrated circuit has an elongate region within which the memory controller circuit is implemented, the memory controller circuit being distributed along the elongate region which extends substantially an entire length of the integrated circuit and is adjacent to an input/output region of the integrated circuit.

5. The apparatus of claim 4, wherein the programmable circuitry includes:
    clock generation circuitry that generates a clock signal; and
    a clock bus that carries the clock signal to a plurality of regions of the integrated circuit; and
    wherein the memory controller circuit is coupled to the clock bus.

6. The apparatus of claim 5,
    wherein the integrated circuit has a clock distribution region through which the clock bus extends;
    wherein portions of the elongate region are overlapped by the clock distribution region in a manner such that the elongate region has overlapped regions and non-overlapped regions;
    wherein the overlapped regions are separated by at least one of the non-overlapped regions; and
    wherein the memory controller circuit is implemented in the non-overlapped regions.

7. The apparatus of claim 1, wherein in each of the blocks, the interconnection section is hard-wired to the circuit section.

8. The apparatus of claim 1, wherein the circuitry has a memory interface that is coupled to the memory controller circuit and that carries data transfers relative to the memory controller circuit, and wherein each of the circuit sections is one of:
    an interface section having interface circuitry that facilitates transfers of data through the memory interface;
    a data port section having a storage element that temporarily stores data involved in data transfers through the memory interface; and
    a control section having circuitry that controls operation of the memory controller circuit.

9. The apparatus of claim 8, wherein the plurality of circuit sections includes first, second, and third subsets of the circuit sections, the first subset including a plurality of the interface sections, the second subset including a plurality of the data port sections, and the third subset including the control section.

10. The apparatus of claim 9,
wherein each of the blocks in which the first subset is implemented has a first dimension measured in a predefined direction;
wherein each of the blocks in which the second subset is implemented has a second dimension measured in the predefined direction; and
wherein each of the blocks in which the third subset is implemented has a third dimension measured in the predefined direction; and
wherein the second dimension is approximately N times the first dimension, N being an integer, and the third dimension is greater than the first dimension and the second dimension.

11. The apparatus of claim 9, wherein the blocks in which the first subset is implemented are interleaved with the blocks in which the second subset is implemented.

12. A method comprising fabricating a device, the fabricating including forming field programmable circuitry that includes a dedicated memory controller circuit before the circuitry is field programmed within a device that includes an integrated circuit, the integrated circuit having a plurality of blocks, wherein the dedicated memory controller circuit is configured to communicate with a memory device external to the integrated circuit, and wherein the dedicated memory controller circuit includes a plurality of circuit sections, each of the circuit sections being implemented with a respective one of the blocks; and
forming, within the programmable circuitry, an interconnect structure having a plurality of field programmable interconnection sections that selectively route electrical signals, the forming the interconnect structure being carried out in a manner so that each of the interconnection sections is implemented in a respective one of the blocks and is coupled to the circuit section in the block.

13. The method of claim 12, wherein the forming the programmable circuitry includes implementing the circuitry in the integrated circuit, and the implementing includes forming the plurality of separate circuit sections in the memory controller circuit, the forming the circuit sections being carried out in a manner so that the circuit sections are physically spaced apart from one another within the integrated circuit, and the forming the circuit sections including one of:
forming a plurality of data port sections that temporarily store data being transferred relative to the memory controller circuit and that are each in a respective one of the circuit sections;
forming a plurality of interface sections that facilitate transfers of data relative to the memory controller circuit and that are each in a respective one of the circuit sections; and
forming the plurality of field programmable interconnection sections that selectively route electrical signals that are respective portions of a common interconnect structure and that are each in a respective one of the circuit sections.

14. The method of claim 12, wherein each of the interconnection sections is hard-wired to the circuit section in that block.

15. The method of claim 12, further including:
forming the interconnect structure having field programmable first, second, and third interconnection sections, each having routing circuitry therein;
field programming the routing circuitry; and
routing electrical signals using the routing circuitry in response to the field programming.

16. The method of claim 15,
wherein the forming the interconnect structure includes hard-wiring the first interconnection section to the memory controller circuit; and
wherein the programming the routing circuitry causes the routing circuitry to effect one of:
transferring electrical signals between the memory controller circuit and the second interconnection section through the first interconnection section; and
transferring electrical signals between the second and third interconnection sections through the first interconnection section while bypassing the memory controller circuit.

17. The method of claim 12, wherein the forming the circuitry includes:
implementing the programmable circuitry in the integrated circuit having an elongate region within which the memory controller circuit is implemented, wherein the elongate region extends substantially an entire length of the integrated circuit and is adjacent to an input/output region of the integrated circuit; and
distributing the memory controller circuit along the elongate region.

\* \* \* \* \*